United States Patent
Kikuchi et al.

(10) Patent No.: US 9,584,088 B2
(45) Date of Patent: Feb. 28, 2017

(54) METHOD FOR MANUFACTURING ACOUSTIC WAVE DEVICE

(71) Applicant: Murata Manufacturing Co., Ltd., Nagaokakyo-shi, Kyoto-fu (JP)

(72) Inventors: Taku Kikuchi, Nagaokakyo (JP); Hideaki Takahashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 638 days.

(21) Appl. No.: 13/644,040

(22) Filed: Oct. 3, 2012

(65) Prior Publication Data

US 2013/0029033 A1   Jan. 31, 2013

Related U.S. Application Data

(63) Continuation of application No. PCT/JP2011/077134, filed on Nov. 25, 2011.

(30) Foreign Application Priority Data

Mar. 16, 2011  (JP) ................................. 2011-057377

(51) Int. Cl.
  *H03H 3/02*  (2006.01)
  *H03H 9/02*  (2006.01)
  (Continued)

(52) U.S. Cl.
  CPC ............ *H03H 3/10* (2013.01); *C23C 14/0036* (2013.01); *C23C 14/0042* (2013.01);
  (Continued)

(58) Field of Classification Search
  CPC ........ H03H 9/00; H03H 9/02; H03H 9/02228; H03H 3/00; H03H 3/02; H03H 3/10; H03H 2003/0428; H03H 9/02559; H03H 9/02574; H03H 9/02582; H03H 9/14538; H03H 9/725; H03H 9/02834; C23C 14/34; C23C 14/3407; C23C 14/3421; C23C 14/3428; C23C 14/3435; C23C 14/0036; C23C 14/0042; C23C 14/0073; Y10T 29/42

See application file for complete search history.

(56) References Cited

U.S. PATENT DOCUMENTS 5,646,468 A * 7/1997 Nakahata et al. . H03H 9/02582
5,911,856 A * 6/1999 Suzuki ................ C23C 14/0042
                                                              204/192.13
(Continued)

FOREIGN PATENT DOCUMENTS

JP         04369915 A  * 12/1992
JP      2005-260296 A     9/2005
(Continued)

OTHER PUBLICATIONS

Official Communication issued in International Patent Application No. PCT/JP2011/077134, mailed on Jan. 17, 2012.

*Primary Examiner* — A. Dexter Tugbang
(74) *Attorney, Agent, or Firm* — Keating & Bennett, LLP

(57) ABSTRACT

A method for manufacturing an acoustic wave device with an excellent frequency-temperature profile is performed such that the acoustic wave device produced includes a piezoelectric substrate, an IDT electrode located on the piezoelectric substrate, and a dielectric film mainly including Si and O and arranged on the piezoelectric substrate to cover the IDT electrode. The dielectric film is formed by sputtering in a sputtering gas containing $H_2O$.

19 Claims, 3 Drawing Sheets

(51) Int. Cl.
*C23C 14/34* (2006.01)
*H03H 3/10* (2006.01)
*H03H 3/00* (2006.01)
*H03H 9/00* (2006.01)
*H03H 9/145* (2006.01)
*C23C 14/00* (2006.01)
*H03H 3/04* (2006.01)
*H03H 9/72* (2006.01)

(52) U.S. Cl.
CPC .......... *C23C 14/0073* (2013.01); *C23C 14/34* (2013.01); *C23C 14/3407* (2013.01); *C23C 14/3421* (2013.01); *C23C 14/3428* (2013.01); *C23C 14/3435* (2013.01); *H03H 3/00* (2013.01); *H03H 3/02* (2013.01); *H03H 9/00* (2013.01); *H03H 9/02* (2013.01); *H03H 9/02228* (2013.01); *H03H 9/02559* (2013.01); *H03H 9/02574* (2013.01); *H03H 9/02582* (2013.01); *H03H 9/02834* (2013.01); *H03H 9/14538* (2013.01); *H03H 9/725* (2013.01); *H03H 2003/0428* (2013.01); *Y10T 29/42* (2015.01)

(56) References Cited

U.S. PATENT DOCUMENTS

| | | | | |
|---|---|---|---|---|
| 5,989,654 | A | * | 11/1999 | Yoshioka et al. ....... C23C 14/34 |
| 6,476,691 | B1 | * | 11/2002 | Tsuzuki et al. .... H03H 9/14538 |
| 2007/0169324 | A1 | * | 7/2007 | Yajima et al. .......... Y10T 29/42 |
| 2008/0106354 | A1 | * | 5/2008 | Kando ............... H03H 9/02228 |
| 2008/0296999 | A1 | * | 12/2008 | Kido ........................ H03H 3/10 |
| | | | | 310/313 B |

FOREIGN PATENT DOCUMENTS

| | | | |
|---|---|---|---|
| JP | 2005260296 A | * | 9/2005 |
| JP | 2006-254507 A | | 9/2006 |
| JP | 2006254507 A | * | 9/2006 |
| JP | 201 01 7781 | * | 8/2010 |
| JP | 2010-177819 A | | 8/2010 |
| WO | 2010/101166 A1 | | 9/2010 |
| WO | 2010/131450 A1 | | 11/2010 |

* cited by examiner

METHOD FOR MANUFACTURING ACOUSTIC WAVE DEVICE

BACKGROUND OF THE INVENTION

1. Field of the Invention

The present invention relates to methods for manufacturing an acoustic wave device and, more specifically, to methods for manufacturing an acoustic wave device that includes a piezoelectric substrate, an IDT electrode located on the piezoelectric substrate, and a dielectric film arranged to cover the IDT electrode.

2. Description of the Related Art

Cellular phones and other communication devices usually have a built-in acoustic wave device in their RF (radio frequency) circuit and this device works as a duplexer, an interstage filter, or the like. There are several types of acoustic wave devices available, including those based on surface acoustic waves (surface acoustic wave devices) and those based on boundary acoustic waves (boundary acoustic wave devices).

The acoustic wave device has an IDT electrode on its piezoelectric substrate, and this IDT electrode is driven to generate acoustic waves. The piezoelectric substrate is made of $LiTaO_3$, $LiNbO_3$, or any other similar compound. Acoustic wave devices with a piezoelectric substrate made of these compounds have a negative temperature coefficient of frequency (TCF). Specifically, $LiNbO_3$ substrates have TCFs on the order of −90 ppm/° C. to −70 ppm/° C., and $LiTaO_3$ substrates have TCFs on the order of −40 ppm/° C. to −30 ppm/° C. As a result, acoustic wave devices based on these substrates often fall short of the required frequency-temperature profile that duplexers and interstage filters should have.

A solution to this kind of problem can be found in Japanese Unexamined Patent Application Publication No. 2006-254507, which proposes an acoustic wave device that has a dielectric film in addition to a piezoelectric substrate made of $LiTaO_3$, $LiNbO_3$, or any other similar compound and an IDT electrode formed on the piezoelectric substrate. This dielectric film has a positive TCF and is formed to cover the IDT electrode. The chemical structure of the dielectric film is mainly composed of Si and O and has some bonds substituted with a hydrogen atom, a fluorine atom, and/or a hydroxy group (OH). According to Japanese Unexamined Patent Application Publication No. 2006-254507, this constitution leads to an excellent frequency-temperature profile.

However, the acoustic wave device described in Japanese Unexamined Patent Application Publication No. 2006-254507 is disadvantageous in that its electrical properties may be affected depending on the method chosen for the formation of the dielectric film.

SUMMARY OF THE INVENTION

Preferred embodiments of the present invention solve this problem by providing a method for manufacturing an acoustic wave device that includes a piezoelectric substrate, an IDT electrode located on the piezoelectric substrate, and a dielectric film arranged on the piezoelectric substrate to cover the IDT electrode. By this method, acoustic wave devices with an excellent frequency-temperature profile can be produced without loss of electrical properties.

A method for manufacturing an acoustic wave device according to a preferred embodiment of the present invention relates to methods for manufacturing an acoustic wave device that includes a piezoelectric substrate, an IDT electrode located on the piezoelectric substrate, and a dielectric film mainly including Si and O and arranged on the piezoelectric substrate to cover the IDT electrode. In this method, the dielectric film is preferably formed by sputtering in a sputtering gas containing $H_2O$.

In another particular aspect of a method for manufacturing an acoustic wave device according to a preferred embodiment of the present invention, the dielectric film preferably includes hydrogen atoms and hydroxy groups.

In yet another particular aspect of a method for manufacturing an acoustic wave device according to a preferred embodiment of the present invention, the dielectric film is made of a silicon oxide including a hydrogen atom and a hydroxy group.

In a different particular aspect of a method for manufacturing an acoustic wave device according to a preferred embodiment of the present invention, the dielectric film is preferably formed by sputtering in a sputtering gas containing $H_2O$ at a partial pressure in a range of about 1% to about 6%, inclusive.

Methods according to various preferred embodiment of the present invention make it possible to manufacture acoustic wave devices with an excellent frequency-temperature profile.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
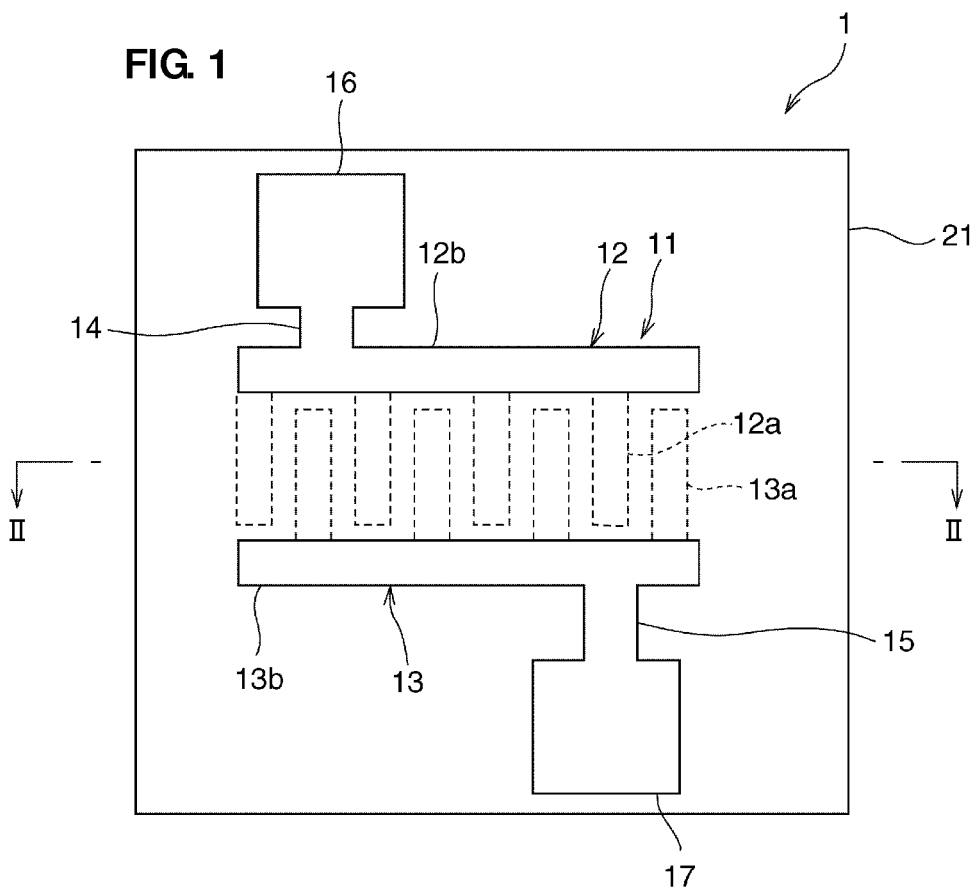
FIG. 1 is a schematic plan view of a surface acoustic wave device 1 prepared according to a preferred embodiment of the present invention.

The following describes preferred embodiments of the present invention. The preferred embodiments are for illustrative purposes only and do not limit the scope of the present invention.

In the drawings referenced hereinafter to explain the preferred embodiments or for other purposes, members having substantially the same function are represented by the same reference sign. Furthermore, these drawings include schematic diagrams; the relative dimensions and other attributes of the illustrated things may be different from the reality. The relative dimensions and other attributes of the illustrated things may differ even from drawing to drawing. The following explanations should be considered in determining the realistic relative dimensions and other attributes of these things.

Figure 2:
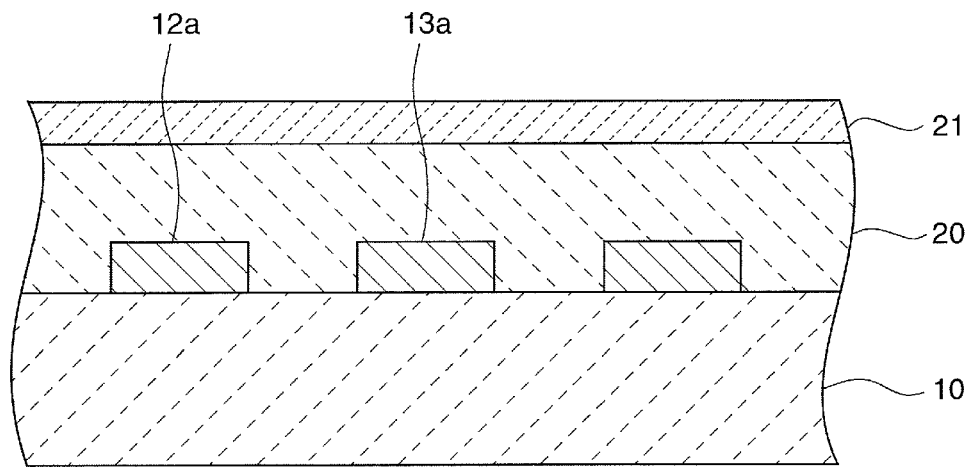
FIG. 2 is a schematic cross-sectional view taken along line II-II in FIG. 1.

FIG. 1 is a schematic plan view of a surface acoustic wave device 1 prepared according to a preferred embodiment of the present invention, and FIG. 2 is a schematic cross-sectional view taken along line II-II in FIG. 1.

First, the constitution of this surface acoustic wave device 1 is described with reference to FIGS. 1 and 2.

Note that although the present preferred embodiment illustrates a manufacturing method of a surface acoustic wave device 1, the manufacturing method according to a preferred embodiment of the present invention is also suitable for the production of boundary acoustic wave devices. Furthermore, although the surface acoustic wave device 1 prepared in the present preferred embodiment preferably takes a form of a one-port surface acoustic wave resonator, the manufacturing method according to preferred embodiments of the present invention is also suitable for the production of surface acoustic wave filters, surface acoustic wave branching filters, and other similar devices.

The surface acoustic wave device 1 preferably uses Rayleigh waves (P and SV waves) as its main mode of operation. However, the main mode of operation of surface acoustic wave devices produced by the manufacturing method according to the present invention is not limited to this. Besides Rayleigh waves, any kind of surface acoustic waves, e.g. Love waves or leaky waves, can be chosen as the main mode of operation.

As illustrated in FIG. 2, the surface acoustic wave device 1 includes a piezoelectric substrate 10. The piezoelectric substrate 10 can be made of any suitable piezoelectric material. For example, $LiNbO_3$, $LiTaO_3$, potassium niobate, quartz, langasite, zinc oxide, lead zirconate titanate, lithium tetraborate, and other similar substances may be used as the piezoelectric material for the piezoelectric substrate 10. Specifically, the piezoelectric substrate 10 used in this preferred embodiment preferably is a 127°-rotated Y-cut X-propagation $LiNbO_3$ substrate.

As illustrated in FIG. 1, the piezoelectric substrate includes an IDT electrode 11 located thereon. The piezoelectric substrate 10 may further have a pair of reflectors arranged in the direction of propagation of surface acoustic waves to sandwich the IDT electrode 11 therebetween.

The IDT electrode 11 has first and second comb-shaped electrodes 12 and 13. The first comb-shaped electrode 12 has two or more electrode fingers 12a arranged along the direction of propagation of surface acoustic waves and a busbar 12b connecting these electrode fingers 12a. Likewise, the second comb-shaped electrode 13 includes two or more electrode fingers 13a arranged along the direction of propagation of surface acoustic waves and a busbar 13b connecting these electrode fingers 13a. The first and second comb-shaped electrodes 12 and 13 are intercalated into each other. In other words, the first and second comb-shaped electrodes 12 and 13 are positioned so that their electrode fingers 12a and 13a should be alternately arranged in the direction of propagation of surface acoustic waves. In this preferred embodiment, the IDT electrode 11 emits acoustic waves preferably with a wavelength of about 1.9 μm and has a metallization ratio of about 0.5, for example.

As illustrated in FIG. 1, the piezoelectric substrate 10 further includes leads 14 and 15 and pads 16 and 17 located thereon. The IDT electrode 11 is connected to the pads 16 and 17 via the leads 14 and 15, respectively.

The IDT electrode 11, the leads 14 and 15, and the pads 16 and 17 can each be made of any suitable electroconductive material. For example, metals such as Au, Cu, Ag, W, Ta, Pt, Ni, Mo, Al, Ti, Cr, Pd, Co, and Mn, alloys containing one or more of these metals as the main ingredient or ingredients, and other similar substances may be used as the material for each of the IDT electrode 11, the leads 14 and 15, and the pads 16 and 17. Furthermore, the IDT electrode 11, the leads 14 and 15, and the pads 16 and 17 preferably may each be a laminate of two or more electroconductive films based on these metals or alloys.

Specifically, the IDT electrode 11 used in the present preferred embodiment preferably is a laminate including a NiCr layer (thickness: about 10 nm), a Pt layer (thickness: about 33 nm), a Ti layer (thickness: about 10 nm), an Al—Cu alloy layer (thickness: about 130 nm), and another Ti layer (thickness: about 10 nm) stacked in this order from the piezoelectric substrate 10 side, for example, and thus has a high reflection coefficient. On the other hand, the leads 14 and 15 and the pads 16 and 17 are laminates each preferably including an Al—Cu alloy layer (thickness: about 700 nm), a Ti layer (thickness: about 600 nm), and an Al layer (thickness: about 1140 nm) stacked in this order from the piezoelectric substrate 10 side, for example.

The IDT electrode 11, the leads 14 and 15, and the pads 16 and 17 can be formed by any suitable method without particular limitation; suitable micromachining techniques for thin layers such as lift-off processes based on vapor deposition, sputtering, or any other similar operation can be used to form these components.

As illustrated in FIG. 2, the piezoelectric substrate 10 further includes a dielectric film 20 formed thereon to cover the IDT electrode 11 at least over the electrode fingers 12a and 13a. In this preferred embodiment, the dielectric film 20 is preferably formed so as to leave the busbars 12b and 13b, the leads 14 and 15, and the pads 16 and 17 exposed while extending over the electrode fingers 12a and 13a and all the remaining area of the piezoelectric substrate 10. This means that in this preferred embodiment, the dielectric film 20 preferably covers the region over which surface acoustic waves are propagated.

The dielectric film 20 used in this preferred embodiment preferably mainly includes Si and O. Specifically, the dielectric film 20 preferably mainly includes Si and O and contains hydrogen (H) atoms and hydroxy (OH) groups. The piezoelectric substrate 10, made of $LiNbO_3$, has a negative TCF, whereas the dielectric film 20, the main constituent elements of which are Si and O, has a positive TCF. Because of this, the dielectric film 20 improves the frequency-temperature profile of the surface acoustic wave device 1.

Specifically, the dielectric film 20 used in this preferred embodiment is preferably made of a silicon oxide containing hydrogen atoms and hydroxy groups.

The dielectric film 20 may have any thickness without particular limitation as long as surface acoustic waves generated by the IDT electrode 11 can be used as the main mode of operation. Preferably, however, the dielectric film 20 preferably has a thickness large enough to embed the electrode fingers 12a and 13a of the IDT electrode 11. In other words, the dielectric film 20 is preferably thicker than the electrode fingers 12a and 13a of the IDT electrode 11. This ensures an excellent frequency-temperature profile. For example, the thickness of the dielectric film 20 may be on the order of about 20% to about 50% of the wavelength of the surface acoustic waves generated, for example. When two or more copies of the surface acoustic wave device 1 are used to construct a ladder-type surface acoustic wave filter, too large a thickness of the dielectric film 20 may interfere with the formation of the passband and thereby lead to filter characteristics worse than desired, but too small a thickness of the dielectric film 20 may cause an insufficient improvement of the frequency-temperature profile. Specifically, the dielectric film 20 used in this preferred embodiment preferably is designed to have a thickness of about 620 nm, for example.

In this preferred embodiment, the dielectric film 20 is covered with an overcoat 21 to protect the dielectric film 20. The overcoat 21 may have any thickness without particular limitation as long as surface acoustic waves generated by the IDT electrode 11 can be used as the main mode of operation.

Preferably, the overcoat 21 is made of a material less permeable to $H_2O$ than that for the dielectric film 20 and is resistant to moisture. It is also preferred that the overcoat 21 is made of a material that can propagate surface acoustic waves faster than that for the dielectric film 20; this makes it possible to adjust the frequency characteristics of the surface acoustic wave device 1 by controlling the thickness of the overcoat 21 by etching or any other suitable treatment.

Specifically, it is preferred that the overcoat 21 is a monolayer of $SiO_2$ or any other silicon oxide, SiN, $Si_3N_4$, or any other silicon nitride, SiON or any other silicon oxynitride, SiC, $Ta_2O_5$, $TiO_2$, TiN, $Al_2O_3$, $TeO_2$, or any other similar compound or a laminate of layers made of these compounds. More specifically, the overcoat 21 used in this preferred embodiment preferably is a SiN film having a thickness of about 20 nm, for example. The surface acoustic wave device 1 has an improved resistance to moisture due to the overcoat 21 and, furthermore, it is also possible to adjust the frequency characteristics of the surface acoustic wave device 1 by controlling the thickness of the overcoat 21.

The overcoat 21 can be formed by any suitable method without particular limitation. For example, vapor deposition, sputtering, CVD, and other similar methods can be used to form the overcoat 21.

Next, the method for manufacturing a surface acoustic wave device 1 according to the present preferred embodiment is described.

In the present preferred embodiment, an IDT electrode 11 is first formed on a piezoelectric substrate 10. The IDT electrode 11 can be formed by, for example, a lift-off process based on vapor deposition.

Then, a dielectric film 20 is formed by sputtering. Specifically, the dielectric film 20 can be formed by bias sputtering, DC sputtering, DC-pulsed sputtering, RF sputtering, magnetron sputtering, ion-beam sputtering, reactive sputtering, transition-region-controlled reactive sputtering, and other sputtering techniques. In this preferred embodiment, specifically, the dielectric film 20 is preferably formed by bias sputtering. Forming the dielectric film 20 by bias sputtering prevents the formation of a gap between the dielectric film 20 and the IDT electrode 11 and thus makes the surface acoustic wave device 1 highly reliable. The details of the formation of the dielectric film 20 by bias sputtering are as follows.

The sputtering gas is a gas mixture of Ar and $O_2$ containing vaporized $H_2O$. Specifically, liquid $H_2O$ is vaporized into a gas using a vaporizer, the $H_2O$ gas is added to an Ar—$O_2$ gas mixture until an $H_2O$ partial pressure of about 6%, for example, while the gas flow rate is controlled with a mass flow controller, and the obtained gas mixture is introduced into a film-formation chamber. The $H_2O$ partial pressure herein is defined as the pressure of the $H_2O$ gas in the film-formation chamber that would be reached when the $H_2O$ gas had the same volume as the whole gas mixture. Bias sputtering in this sputtering gas produces a dielectric film 20 mainly including Si and O and containing hydrogen atoms and hydroxy groups.

In the present invention, $H_2O$ partial pressures are measurements obtained using a quadrupole mass spectrometer.

Note that although in the present preferred embodiment $H_2O$ is vaporized using a vaporizer and introduced into the sputtering gas with a mass flow controller, the present invention is not limited to this. It is also possible to use a gas mixture containing an adjusted concentration of $H_2O$ prepared by vaporizing $H_2O$ in advance and adding the vapor to either or both of the planned components of the sputtering gas, i.e. an Ar gas and an $O_2$ gas. This approach also allows for the adjustment of the $H_2O$ partial pressure in the sputtering gas.

Then, the dielectric film 20 is flattened by etch back using a sacrificial layer. Any unevenness on the surface of the dielectric film 20 leads to an increased insertion loss of the surface acoustic wave device and thus the dielectric film 20 is required to have a flat surface. Furthermore, forming an overcoat 21 to cover the dielectric film 20 with any unevenness left on the surface of the dielectric film 20 results in the overcoat 21 being thinner in some areas around the hills and valleys. Etching the overcoat 21 in this situation to control its thickness to adjust the frequency characteristics of the surface acoustic wave device causes the overcoat 21 to be removed in some areas and the surface of the dielectric film 20 exposed. As a result, the surface acoustic wave device is lacking in resistance to moisture and other performance characteristics. This is another reason why the dielectric film 20 preferably has a flat surface.

Then, an overcoat 21 is formed by vapor deposition, sputtering, CVD, or any other suitable technique to complete the surface acoustic wave device 1.

The surface acoustic wave device 1 produced in this way has not only excellent electrical properties but also an outstanding frequency-temperature profile. The reasons for this are as follows.

Figure 3:
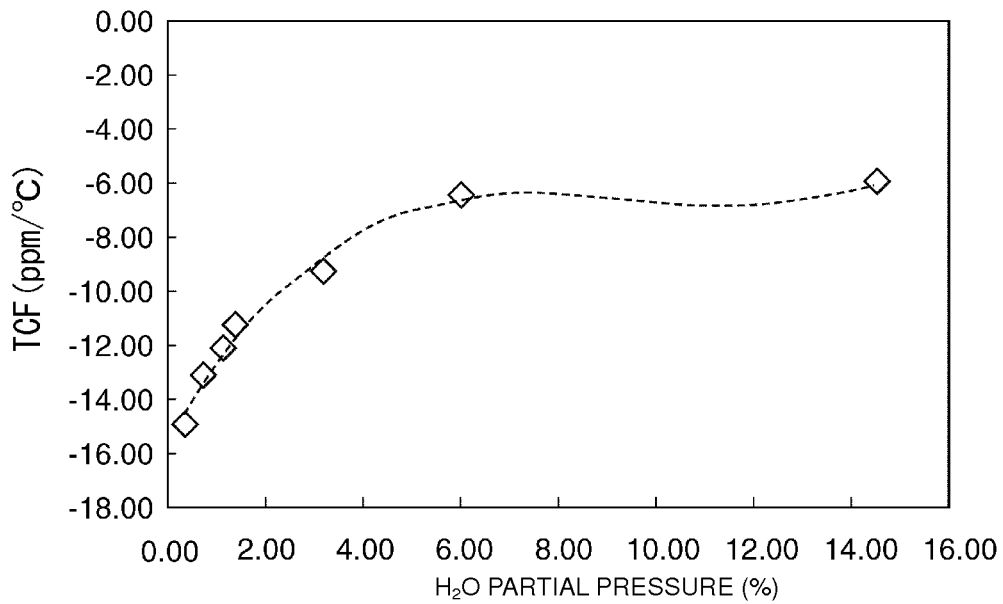
FIG. 3 is a graph showing the relationship between the TCF of each surface acoustic wave device and the $H_2O$ partial pressure in the sputtering gas used to form its dielectric film.

Surface acoustic wave devices were made with different $H_2O$ partial pressures in the sputtering gas for forming the dielectric film, and their TCFs were measured. Their constitution was the same as that of the surface acoustic wave device 1 except for the $H_2O$ partial pressure. FIG. 3 shows the relationship between the TCF of each surface acoustic wave device and the $H_2O$ partial pressure in the sputtering gas used to form its dielectric film.

As can be seen from FIG. 3, different $H_2O$ partial pressures for film formation resulted in different TCFs even with a fixed thickness of the dielectric film. Specifically, the higher the $H_2O$ partial pressure for film formation was, the closer to 0 ppm/° C. the TCF of the surface acoustic wave device was. This result indicates that the TCF of a surface acoustic wave device can be improved by increasing the $H_2O$ partial pressure for the formation of its dielectric film without the need to make the dielectric film thicker. For a more effective improvement of the TCF, the $H_2O$ partial pressure in the sputtering gas is preferably equal to or higher than about 1%, for example.

In other words, the $H_2O$ partial pressure can be monitored and controlled during the formation of the dielectric film for more consistent TCFs.

Figure 4:
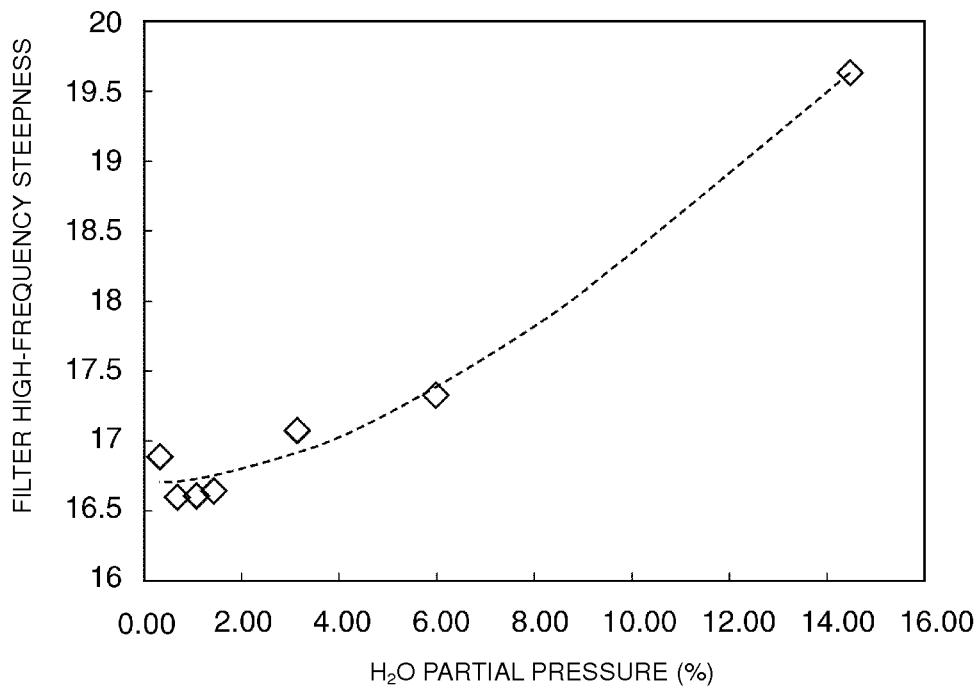
FIG. 4 is a graph showing the relationship between the high-pass-frequency steepness of a transmission filter and the $H_2O$ partial pressure for the formation of the dielectric film.
Figure 6:
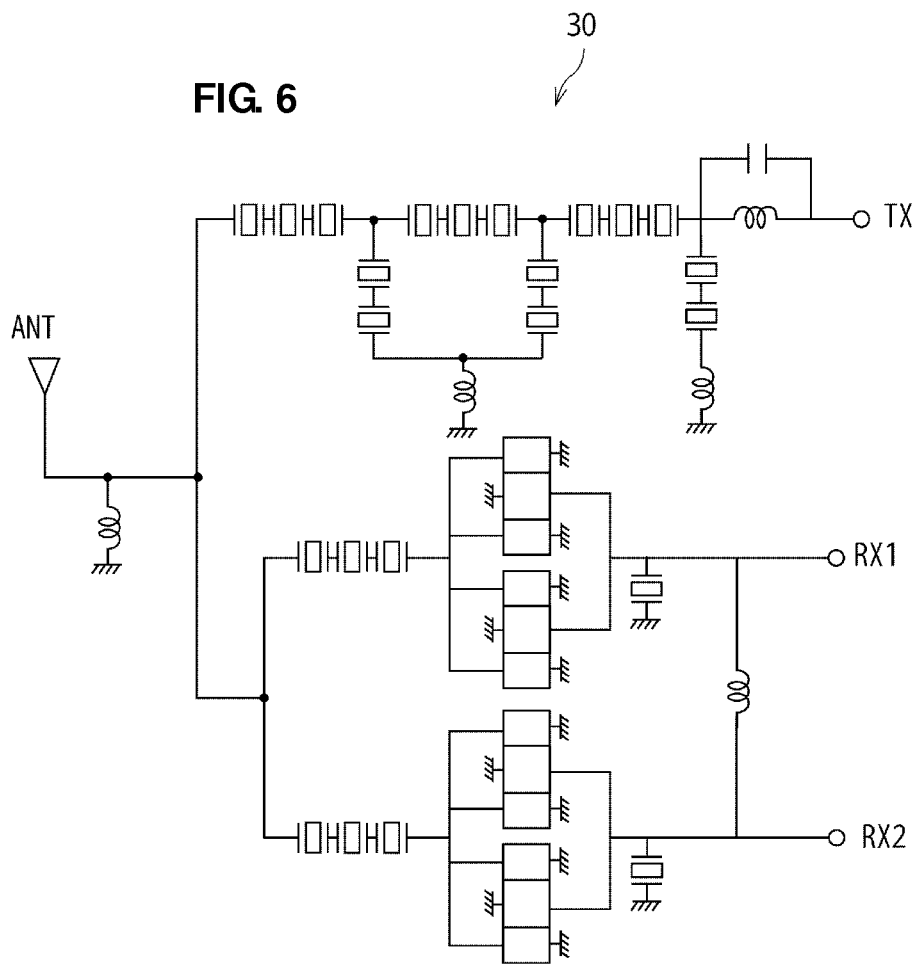
FIG. 6 is an equivalent circuit schematic of the transmission filter prepared.

Then, several surface acoustic wave resonators were made with different $H_2O$ partial pressures for the formation of the dielectric film and used to assemble a ladder-type surface acoustic wave filter. Specifically, the transmission filter 30 illustrated in FIG. 6, a surface acoustic wave branching filter for UMTS-BAND2, was prepared. The transmission frequency band of UMTS-BAND2 is 1850 MHz to 1910 MHz. FIG. 4 shows the relationship between the high-pass-frequency steepness of the transmission filter 30 and the $H_2O$ partial pressure for the formation of the dielectric film. The high-pass-frequency steepness herein is defined as the difference between the frequency in the high-frequency region of the passband at which the insertion loss is about 2.5 dB and that at which the insertion loss is about 40 dB, and smaller differences mean better steepness levels.

As can be seen from FIG. 4, different $H_2O$ partial pressures for film formation resulted in different high-pass-frequency steepness levels of the transmission filter 30 even with a fixed thickness of the dielectric film. Specifically, the higher the $H_2O$ partial pressure for film formation was, the worse the high-pass-frequency steepness of the transmission filter 30 was. This result indicates that the TCF of the transmission filter 30 can be improved by increasing the $H_2O$ partial pressure for the formation of the dielectric film without the need to make the dielectric film thicker, but along with some reduction in electrical properties depending on conditions.

Figure 5:
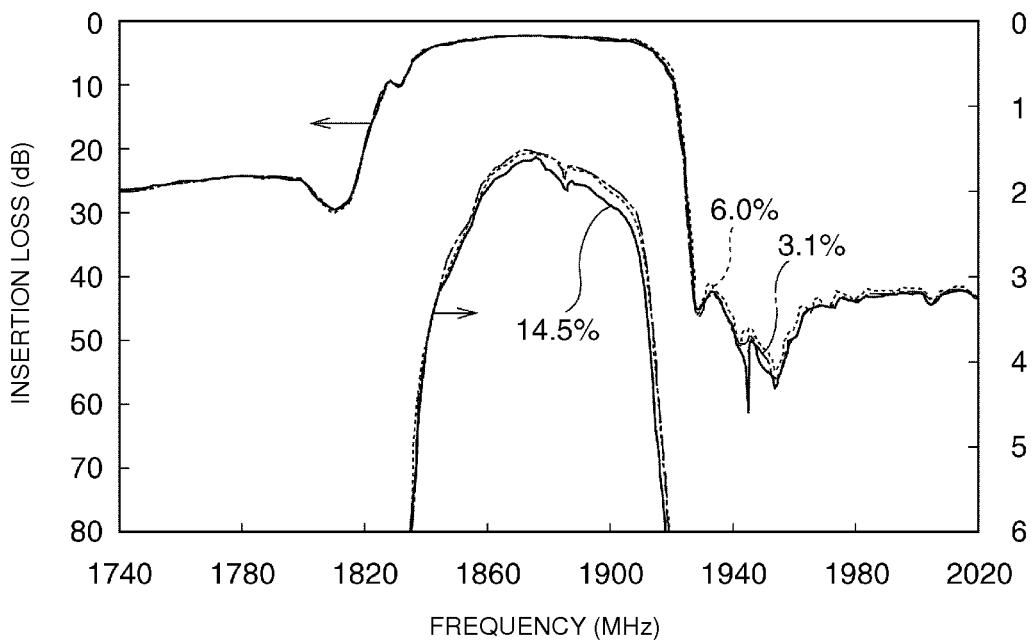
FIG. 5 is a graph showing the filter characteristics of a transmission filter prepared with the $H_2O$ partial pressure for the formation of the dielectric film set at 3.1%, 6.5%, and 14.5%.

FIG. 5 shows the filter characteristics of the transmission filter 30 prepared with the $H_2O$ partial pressure for the formation of the dielectric film set at about 3.1%, about 6.0%, and about 14.5%, for example.

As presented in FIG. 5, the higher the $H_2O$ pressure for the formation of the dielectric film was, the worse the passband insertion loss was. A particular problem with this is that worse passband insertion losses for waves falling in the high-frequency region lead to worse high-pass-frequency steepness levels. Probably, the $H_2O$ partial pressure for the formation of the dielectric film determines the elastic constants of the dielectric film and thereby determines the propagation loss of surface acoustic waves. A higher $H_2O$ partial pressure for the formation of the dielectric film leads to a greater propagation loss of surface acoustic waves, a worse passband insertion loss for waves falling in the high-frequency region, and eventually a worse high-pass-frequency steepness level.

When the transmission filter 30 is used in a communication system like UMTS-BAND2, in which the gap width between the transmission frequency band (1850 MHz to 1910 MHz) and the receiving frequency band (1930 MHz to 1990 MHz) is as narrow as 20 MHz, its high-pass-frequency steepness measurement should not exceed about 17.5 MHz. As is clear from FIG. 4, any $H_2O$ partial pressure for the formation of the dielectric film equal to or lower than about 6% provides the surface acoustic wave device with not only excellent electric properties but also an outstanding frequency-temperature profile.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a surface acoustic wave device comprising:
    forming the surface acoustic wave device to include a piezoelectric substrate that has a negative temperature coefficient of frequency, an IDT electrode located on the piezoelectric substrate, and a dielectric film that has a positive temperature coefficient of frequency, mainly includes Si and O, and is arranged on the piezoelectric substrate to cover the IDT electrode; and
    forming the dielectric film by sputtering in a sputtering gas containing $H_2O$ and having an $H_2O$ partial pressure in a range of about 1% to about 6%, inclusive.

2. The method for manufacturing an acoustic wave device according to claim 1, wherein the dielectric film includes hydrogen atoms and hydroxy groups.

3. The method for manufacturing an acoustic wave device according to claim 1, wherein the dielectric film is made of a silicon oxide including a hydrogen atom and a hydroxy group.

4. The method for manufacturing an acoustic wave device according to claim 1, wherein the acoustic wave device is one of a surface acoustic wave device, a boundary acoustic wave device, a one-port surface acoustic wave resonator, a surface acoustic wave filter, and a surface acoustic wave branching filter.

5. The method for manufacturing an acoustic wave device according to claim 1, wherein the piezoelectric substrate is made of one of $LiNbO_3$, $LiTaO_3$, potassium niobate, quartz, langasite, zinc oxide, lead zirconate titanate, and lithium tetraborate.

6. The method for manufacturing an acoustic wave device according to claim 1, wherein the piezoelectric substrate is a 127°-rotated Y-cut X-propagation $LiNbO_3$ substrate.

7. The method for manufacturing an acoustic wave device according to claim 1, wherein the IDT electrode is formed to emit acoustic waves with a wavelength of about 1.9 μm and has a metallization ratio of about 0.5.

8. The method for manufacturing an acoustic wave device according to claim 1, further comprising the step of forming leads and pads on the piezoelectric substrate such that the IDT electrode is connected to the pads via the leads.

9. The method for manufacturing an acoustic wave device according to claim 8, wherein the IDT electrode, the leads, and the pads are each made of a metal including one of Au, Cu, Ag, W, Ta, Pt, Ni, Mo, Al, Ti, Cr, Pd, Co, Mn, or alloys containing more than one of the metals.

10. The method for manufacturing an acoustic wave device according to claim 1, wherein the IDT electrode includes at least two electroconductive films.

11. The method for manufacturing an acoustic wave device according to claim 1, wherein the IDT electrode is a laminate including a NiCr layer, a Pt layer, a first Ti layer, an Al—Cu alloy layer, and a second Ti layer stacked in this order from a side of the piezoelectric substrate.

12. The method for manufacturing an acoustic wave device according to claim 1, wherein the IDT electrode is formed by one of vapor deposition and sputtering.

13. The method for manufacturing an acoustic wave device according to claim 1, wherein the dielectric film is formed so as to leave exposed busbars, leads and pads, and to cover only electrode fingers of the IDT electrode and remaining areas of the piezoelectric substrate.

14. The method for manufacturing an acoustic wave device according to claim 1, further comprising a step of flattening the dielectric film by using a sacrificial layer.

15. The method for manufacturing an acoustic wave device according to claim 14, further comprising the step of forming an overcoat over the dielectric film, after the step of flattening.

16. The method for manufacturing an acoustic wave device according to claim 15, wherein the overcoat is made of at least one of a silicon oxide, a silicon nitride, a silicon oxynitride, SiC, $Ta_2O_5$, $TiO_2$, TiN, $Al_2O_3$, and $TeO_2$.

17. The method for manufacturing an acoustic wave device according to claim 15, wherein the step of forming the overcoat includes performing one of vapor deposition, sputtering, and chemical vapor deposition, to form the overcoat.

18. The method for manufacturing an acoustic wave device according to claim 1, wherein the sputtering is bias sputtering and uses a sputtering gas mixture including Ar and $O_2$ containing vaporized $H_2O$.

19. The method for manufacturing an acoustic wave device according to claim 1, wherein in the sputtering, liquid $H_2O$ is vaporized into a gas using a vaporizer, $H_2O$ gas is added to an Ar—$O_2$ gas mixture until an $H_2O$ partial pressure of about 6%, while a flow rate of the gas is controlled with a mass flow controller, and the obtained gas mixture is introduced into a film-formation chamber.

* * * * *